United States Patent
Simburger et al.

(10) Patent No.: US 7,259,323 B2
(45) Date of Patent: Aug. 21, 2007

(54) THIN FILM SOLAR CELL THERMAL RADIATOR

(75) Inventors: Edward J. Simburger, Agoura, CA (US); David G. Gilmore, West Hollywood, CA (US)

(73) Assignee: The Aerospace Corporation, El Segundo, CA (US)

( * ) Notice: Subject to any disclaimer, the term of this patent is extended or adjusted under 35 U.S.C. 154(b) by 557 days.

(21) Appl. No.: 10/420,480

(22) Filed: Apr. 22, 2003

(65) Prior Publication Data

US 2004/0211460 A1    Oct. 28, 2004

(51) Int. Cl.
*H01L 31/052* (2006.01)
(52) U.S. Cl. ............... 136/259; 136/293; 438/59
(58) Field of Classification Search ........... 136/293; 438/59

See application file for complete search history.

(56) References Cited

U.S. PATENT DOCUMENTS

| 6,300,158 B1 * | 10/2001 | Simburger et al. ......... 438/59 |
| 6,583,349 B2 * | 6/2003 | Tanaka ..................... 136/246 |
| 6,593,522 B2 * | 7/2003 | Nakano et al. ............. 136/256 |

* cited by examiner

*Primary Examiner*—Nam Nguyen
*Assistant Examiner*—Anthony Fick
(74) *Attorney, Agent, or Firm*—Derrick Michael Reid

(57) ABSTRACT

A thin film solar cell thermal radiator configuration uses an embedded power bus to collect vertically migrating waste heat from electronic devices mounted on a thin film multi-layer printed circuit board. The waste heat is vertically collected, horizontally spread, and vertically rejected through the a top coverglass glass layer around the side of a top silver contact of conventional thin film solar cells. The thermal radiator configuration enables the collection and rejection of the electronic component waste heat for maintaining thin film solar cells within desired temperature ranges.

15 Claims, 2 Drawing Sheets

THIN FILM SOLAR CELL THERMAL RADIATOR

THIN FILM SOLAR CELL THERMAL RADIATOR

THIN FILM SOLAR CELL TOP THERMAL RADIATOR
MANUFACTURING FLOW DIAGRAM

THIN FILM SOLAR CELL THERMAL RADIATOR

FIELD OF THE INVENTION

The invention relates to the field of thin film solar cell and heat radiators. More particularly, the present invention relates to thin film power bus bars for radiating heat in solar cells.

BACKGROUND OF THE INVENTION

The aerospace industry has developed designs for microsatellites and nanosatellites. This development of small space systems is likely to increase with new technologies that can be used to incorporate multiple functions in a small satellite. In U.S. Pat. No. 6,300,158 titled Integrated Solar Power Module, a method is described for producing thin film solar cells that are integrated with a multilayer printed wiring board and power processing electronics. However, the integrated solar power module does not address the problem of rejecting excessive heat produced by the active electronic components that are mounted on the back of the thin film solar cell substrate.

Active electronic components convert some of the electrical energy passing through the electronic components into heat. Most electronic components have maximum junction operating temperatures in the 80° to 125° C. range. The operating temperature of the thin film solar cells is in the 70° to 80° C. range. These thin film solar cells must reject excessive heat produced by the mounted electronic devices to maintain an operating temperature below the maximum operating temperature for the thin film solar cells. Further refinements of the integrated solar power module may have some portions of the thin film solar cell coated with a material that would have a low solar radiation absorptance and high thermal emissivity for maintaining the solar cells within a desirable temperature range. The entire solar cell assembly and current collectors are covered with a transparent polymer coverglass, which provides a front surface that has a high thermal emissivity. The existing design of the thin film solar cells presently has large silver current collectors located on the front of the solar cells. The silver collectors are silver bus bars that are highly reflective and have a low solar absorptance. The bus bars and solar cell structure obstruct thermal transmission through the solar cell. The amount of additional thermal energy that can be rejected from a thin film solar cell that has mounted active heat producing components is limited. These and other disadvantages are solved or reduced using the invention.

SUMMARY OF THE INVENTION

An object of the invention is to provide a heat radiation path for rejecting waste heat of electronic components.

Another object of the invention is to provide heat a radiation path for rejecting waste heat of electronic components mounted on a thin film printed circuit board.

Yet another object of the invention is to provide a heat radiation path for rejecting waste heat of electronic components mounted on a thin film solar cell.

The present invention is directed to a thin film structure that efficiently radiates waste heat, particularly useful in thin film solar cells. In the thin film solar cell, the heat producing electronic components are located behind the solar cell top contact that functions as a thermal radiator. Waste heat generated from bottom mounted electronic components is routed in a first vertical direction, a second horizontal direction, and a third vertical direction, prior to thermal radiation rejection of the waste heat. The invention radiates waste heat using a horizontal metallic bus bar within the multilayer thin film structure, while preserving top silver contacts and the top coverglass layer. The horizontal metallic bus bar that routes power as well as effectively routing waste heat horizontally, from behind the top silver contacts to the sides of the top silver contacts, so that waste heat generated under the top silver contacts where the waste heat can be routed and be ejected through the top coverglass layer.

The coverglass is transparent in the visible and near infrared spectrum and has high thermal emissivity. The silver contact reflects radiation in the visible and near infrared spectrum. The emissivity and reflectivity of the coverglass and silver contact minimize absorption of unwanted solar energy while maximizing the emission of heat in the long infrared spectrum. Consequently, the temperature under the silver contact is minimized, such that, waste heat spread under the silver contact is more effectively radiated. A thermal emissive configuration uses a horizontally disposed power bus in a thermal conducting layer. The power bus overlaps mounted electronic devices so as to collect heat from these heat generating electronic devices and then routes heat to the side of the top silver contacts. The power bus serves to vertically collect and then horizontally spread the waste heat for improved heat rejection from the top coverglass layer around the sides of the top silver contacts. In this configuration, existing solar cell technologies can be made with thin film circuit boards and mounted electronic components generating waste heat, which is efficiently ejected from the thin film solar cell. These and other advantages will become more apparent from the following detailed description of the preferred embodiment.

DETAILED DESCRIPTION OF THE PREFERRED EMBODIMENT

Figure 1:
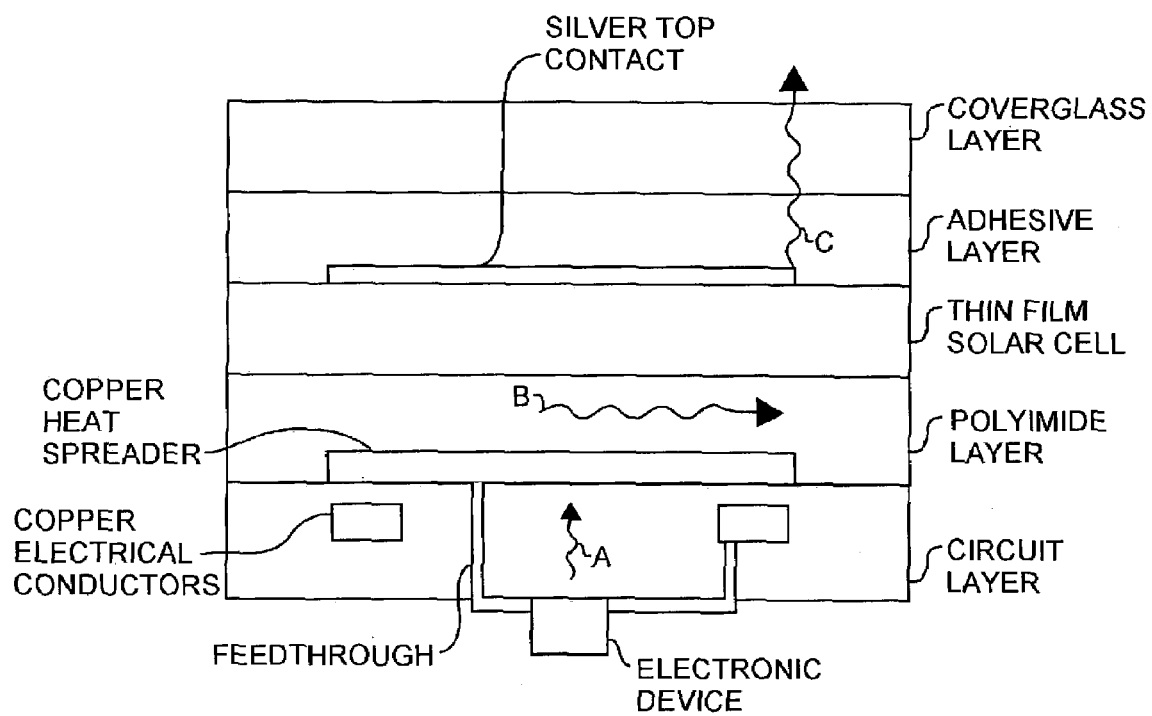
FIG. 1 is a cross section view of thin film solar cell thermal radiator.

An embodiment of the invention is described with reference to the figures using reference designations as shown in the figures. Referring to FIG. 1, a thin film solar cell thermal radiator configuration a silver top contact is shown presenting a conventional thin film solar cell. The silver top contact is reflective and functions as a thermal barrier. An adhesive layer is used to secure a coverglass layer over the thin film solar cell. A copper heat spreader is disposed in a polyimide layer. A circuit layer on the polyimide layer has necessary conductors for routing power and signals through feedthroughs to an electronic device generating waste heat. The circuit layer and polyimide layer function as a flexible printed circuit for supporting the thin film solar cell. The flexible printed circuit would be mounted on the back of the thin film solar cell over the copper heat spreader. The copper heat spreader is deposited on the back of the polyimide layer that functions as a deposition substrate on which the thin film solar cell is fabricated. The size shape and location of the copper heat spreader preferably mirrors the size and shape of the silver top contacts and bus bars on the top of the solar cell. The silver top contacts are used to collect current produced by the thin film solar cell. The solar cell and the silver top contact current collectors are covered by the coverglass layer that may be a transparent polymer film. The transparent polymer film may be directly deposited on the thin film solar cell or may be attached using a pressure sensitive adhesive layer.

In operation, the electronic device is powered by the solar cell with power and signals routed through feedthroughs in the circuit layer. The waste heat can firstly migrate vertically A from the electronic devices towards the copper heat spreader. The copper heat spreader collects the waste heat and migrates the waste heat horizontally B towards the outer edges of the spreader, and more particularly horizontally towards the sides of the spreader, and hence, towards the sides of the top silver contact. The waste heat then migrates vertically C through the top coverglass where the waste heat is ejected as radiated heat. In this manner, waste heat from the electronic devices migrates through the thin film solar cell thermal radiator for maintaining thermal control.

A thin film solar cell has silver bus bars as extensions of the silver top contact and is used to collect the current produced by the solar cell. The heat producing electronic device is disposed behind the solar cell and under the silver bus bars. The electronic device is small but can generate a significant amount of heat. Hence, a large surface area for the thermal radiator is needed to reject this waste heat. To horizontally spread the waste heat over the available surface area, the thin copper heat spreader is used. The thickness of the copper heat spreader affects the efficiency of the heat rejection radiator. The thin film solar cell radiator can effectively be used to migrate and spread waste heat for efficient heat radiation. Many electronic devices can be supported by the multilayer printed wiring board circuit layer, for providing the solar cell with a power regulator and other electronic functions.

Figure 2:
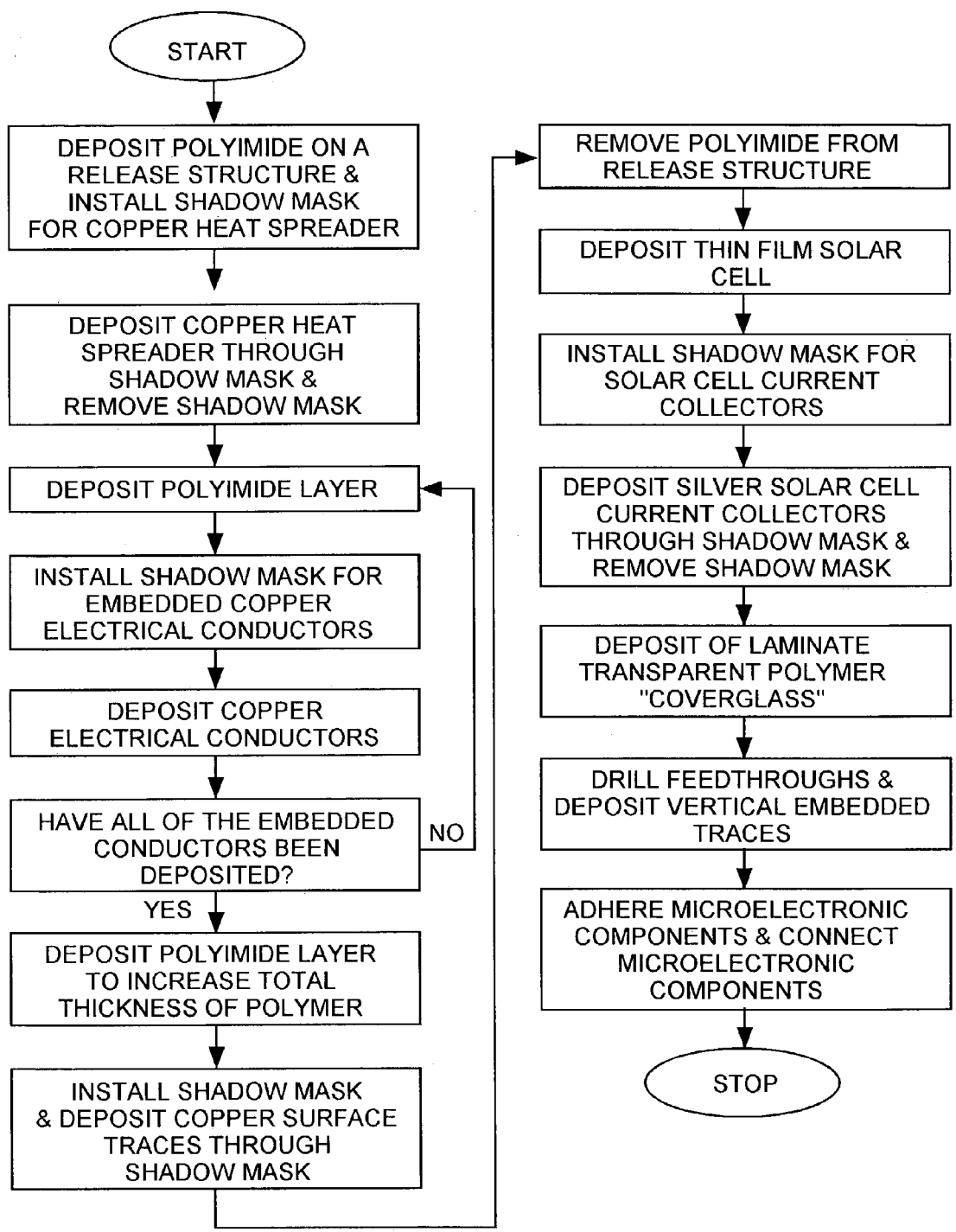
FIG. 2 is a flow diagram of a thin film solar cell top thermal radiator manufacturing process.

Referring to FIGS. 1 and 2, the manufacturing steps for producing the thin film Solar Cell radiator uses conventional semiconductor thin film processes. FIG. 2 discloses a preferred and exemplar manufacturing process. The polyimide layer is deposited on a release structure, such as a sheet of glass. The polyimide layer is patterned with a shadow mask for patterning the copper heat spreader. Copper is then deposited through the shadow mask onto the patterned polyimide layer, for forming the heat spreader. The shadow mask is then removed. Next the circuit layer is formed on the polyimide layer, by depositing a plurality of polyimide layers with necessary shadow masks and embedded copper electrical trace conductors for forming the circuit layer. The circuit layer thickness can be increased in size using additional layers of polyimide as desired. When all of the electrical conductors in the circuit layers have been deposited, and when all of the polyimide layers forming the circuit layer have been deposited, a shadow mask is used to deposit surface copper traces on the exposed final back surface of the circuit layer.

After forming the polyimide layer and the circuit layer, the polyimide layer is released from the release structure, thereby separating the polyimide layer with the deposited circuit layer from the release structure. After forming the polyimide layer and circuit layer, a thin film solar cell is then deposited on the top exposed side of the polyimide layer. After depositing the thin film solar cells, a shadow mask is used to form the silver cell top current collectors. The top contact consists of multiple metal layers deposited in sequence. A 500 Angstroms layer of titanium is deposited over the transparent conductive metal oxide layer of the thin film solar cell. The titanium provides a glue layer due to affinity to oxygen in the transparent metal oxide. A 1000 Angstrom layer of palladium is deposited to provide a barrier layer to prevent silver migration into the thin film solar cell. A 15,000 Angstrom layer of silver is deposited over the palladium layer to form the electrical current collector for the thin film solar cell. Silver is deposited to form the top contact current collector and the shadow mask is then removed. A coverglass may be deposited onto the solar cell, or may be installed as a laminated structure, using an adhesive layer for bonding the coverglass to the top of the thin film solar cell. After installation of the coverglass, feedthroughs are drilled through the circuit layer, and copper conductive traces are deposited into the feedthroughs. Finally, an electronic device is bonded to the exposed surface of the circuit layer with the electronic device electrically connected to the surface trace conductors that route power and signals through the feedthroughs and embedded traces, as desired.

The invention is directed to a thin film solar cell radiator having an embedded heat spreader for horizontally spreading waste heat collected from under a top contact of the thin film solar cell to the sides of the top contact, where the waste heat can be effectively radiated. In the preferred form, electronic devices are disposed on a multilayer circuit layer functioning as a flexible printed circuit board for supporting an electronic device well situated for regulating the solar cell. Those skilled in the art can make enhancements, improvements, and modifications to the invention, and these enhancements, improvements, and modifications may nonetheless fall within the spirit and scope of the following claims.

What is claimed is:

1. A thin film radiator for radiating waste heat from an electronic device, the radiator comprising,
   an electrical contact in a thin film layer,
   a cover layer for radiating the waste heat migrating vertically through the cover layer, the cover layer being disposed over the electrical contact,
   a spreader disposed between the electronic device and the thin film layer and sized to cover the electronic device for migrating horizontally the waste heat under the electrical contact and from the electronic device, and
   a circuit layer for migrating vertically the waste heat from the electronic device, wherein,
   the thin film layer is a thin film solar cell, and
   the electrical contact is a top contact of the thin film solar cell, and
   the spreader is encapsulated in a thermal emissive material.

2. The radiator of claim 1 wherein,
   the electrical contact is a current collection bus of the thin film solar cell.

3. The radiator of claim 1 wherein,
   the electrical contact is a silver current collection bus of the thin film solar cell.

4. The circuit layer of claim 1 comprises,
   a plurality of polyimide layers, and
   a plurality of conductor traces for interconnecting the electronic device to the electrical contact.

5. The thin film radiator of claim 1 wherein
   the electrical contact is a silver current collection bus of the thin film solar cell, and
   the circuit layer comprises,
   a plurality of polyimide layers, and
   a plurality of conductor traces for interconnecting the electronic device to the electrical contact of the thin film solar cell.

6. The thin film radiator of claim 1 wherein, the spreader is made of copper.

7. The thin film radiator of claim 1 wherein, the spreader is planar and sized to the electrical contact.

8. The thin film radiator of claim 1 wherein the cover layer comprises,
a coverglass layer, and
an adhesive layer, the adhesive layer bonding the coverglass layer to the thin film layer.

9. The thin film radiator of claim 1 wherein the cover layer comprises,
a layer of polyimide.

10. The thin film radiator of claim 1 wherein, the circuit layer comprises,
a plurality of polyimide layers,
a plurality of conductor traces for interconnecting the electronic device to the electrical contact, and
a plurality of feedthrough traces for interconnecting the electronic device to the electrical contact.

11. The thin film radiator of claim 1 wherein,
the spreader is a power bus bar for conununicating power to the electronic device.

12. The thin film radiator of claim 1 wherein,
the electrical contact is a silver current collection bus of the thin film solar cell, and
the spreader is a power bus bar for communicating power from the solar cell to the electronic device.

13. The thin film radiator of claim 1 wherein, the electrical contact is reflective.

14. The thin film radiator of claim 1 wherein, the spreader is encapsulated in polyimide.

15. The thin film radiator of claim 1 wherein, the spreader is disposed in a first thermal emissive layer between the thin film solar cell and the circuit layer, and the circuit layer is a second thermal emissive layer.

* * * * *